United States Patent
Low et al.

(10) Patent No.: US 8,153,466 B2
(45) Date of Patent: Apr. 10, 2012

(54) MASK APPLIED TO A WORKPIECE

(75) Inventors: Russell J. Low, Rowley, MA (US);
Julian G. Blake, Gloucester, MA (US);
Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 278 days.

(21) Appl. No.: 12/689,605

(22) Filed: Jan. 19, 2010

(65) Prior Publication Data
US 2010/0184243 A1  Jul. 22, 2010

Related U.S. Application Data

(60) Provisional application No. 61/146,078, filed on Jan. 21, 2009.

(51) Int. Cl.
*H01L 21/00* (2006.01)
(52) U.S. Cl. ............ 438/57; 257/E31.001; 427/523
(58) Field of Classification Search .......... 438/57
See application file for complete search history.

(56) References Cited

U.S. PATENT DOCUMENTS

| | | | |
|---|---|---|---|
| 2001/0015259 A1* | 8/2001 | Toyoda et al. | 156/344 |
| 2002/0093040 A1* | 7/2002 | Tomita | 257/270 |
| 2007/0128357 A1 | 6/2007 | Branton et al. | |
| 2007/0262050 A1 | 11/2007 | Golovchenko et al. | |
| 2009/0041949 A1 | 2/2009 | Golovchenko et al. | |
| 2009/0173716 A1 | 7/2009 | Branton et al. | |

OTHER PUBLICATIONS

Joong Yull Park et al., "Ice-lithographic fabrication of concave microwells and a microfluid network," Biomed Microdevices, 2009, pp. 129-133, vol. 11.
Gavin M. King et al., "Nanometer Patterning with Ice," Nano Letters, Jun. 2005, pp. 1-8, vol. 5(6): 1157-1160.

* cited by examiner

*Primary Examiner* — Lex Malsawma

(57) ABSTRACT

A method of fabricating a workpiece is disclosed. A material defining apertures is applied to a workpiece. A species is introduced to the workpiece through the apertures and the material is removed. For example, the material may be evaporated, may form a volatile product with a gas, or may dissolve when exposed to a solvent. The species may be introduced using, for example, ion implantation or gaseous diffusion.

18 Claims, 5 Drawing Sheets

MASK APPLIED TO A WORKPIECE

CROSS-REFERENCE TO RELATED APPLICATIONS

This application claims priority to the provisional patent application entitled "Mask Applied to a Solar Cell," filed Jan. 21, 2009 and assigned U.S. App. No. 61/146,078, the disclosure of which is hereby incorporated by reference.

FIELD

This invention relates to doping a workpiece and, more particularly, to doping a workpiece with a mask.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity after activation.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

In fabricating a solar cell, two factors must be considered. The first factor is series resistance (Rs), or the total resistance of the solar cell material. Rs limits the fill factor, or the ratio of the maximum power point divided by the product of the open circuit voltage ($V_{oc}$) and the short circuit current ($I_{sc}$). As Rs increases, the voltage drop between the junction voltage and the terminal voltage becomes greater for the same flow of current. This results in a significant decrease in the terminal voltage V and a slight reduction in $I_{sc}$. Very high values of Rs also produce a significant reduction in $I_{sc}$. In such regimes, the Rs dominates and the behavior of the solar cell resembles that of a resistor. Thus, if $V_{oc}$ and/or $I_{sc}$ decrease, then the cell efficiency decreases as well. This decrease may be a linear function in one instance.

The second factor is photon conversion efficiency, which limits short circuit current. If the front surface of a solar cell is doped at a high level, series resistance will be reduced but recombination loss of the charge carriers increases. This recombination occurs due to interstitial dopants that are not incorporated into the crystal lattice. These dopant sites become recombination centers. This phenomenon is called Shockley-Read-Hall recombination. A solution that reduces recombination loss is to elevate doping levels only under the front surface contacts of the solar cell. This technique is known as a selective emitter.

One method to form a selective emitter in a solar cell is to perform a high-dose implant selectively in a region where the metal contacts or other conductors will eventually be formed. This requires either an expensive photolithography step or the use of a shadow or stencil mask to perform a selective or patterned implant. If a shadow or stencil mask is used, it must be carefully aligned to the desired implant areas. This may require an accuracy of approximately 10-20 μm for current solar cell designs. Accordingly, there is a need in the art for an improved method of selectively doping workpieces.

SUMMARY

According to a first aspect of the invention, a method of fabricating a workpiece is provided. The method comprises applying a material to a workpiece. The material defines a plurality of apertures. The material is selected from the group consisting of wax, carbon dioxide, xenon difluoride, and xenon trifluoride. A species is introduced into the workpiece through the plurality of apertures. The material is evaporated off the workpiece.

According to a second aspect of the invention, a method of fabricating a workpiece is provided. The method comprises applying a material to a workpiece. The material defines a plurality of apertures. A species is introduced into the workpiece through the plurality of apertures. The workpiece is exposed to a gas and a volatile product is formed from the material, thereby removing the material from the workpiece. The workpiece is activated. Exposing the workpiece to a gas, forming a volatile product, and activating occur at least partially simultaneously.

According to a third aspect of the invention, a method of fabricating a workpiece is provided. The method comprises applying a material to a workpiece. The material defines a plurality of apertures. A species is introduced into the workpiece through the plurality of apertures. The material is exposed to a solvent and is dissolved from the workpiece.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the process described herein may be performed by, for example, a beam-line ion implanter or a plasma doping ion implanter. Such a plasma doping ion implanter may use RF or other plasma generation sources. Other plasma processing equipment, flood ion implanters, or equipment that generates ions also may be used. Thermal or furnace diffusion, pastes on the surface of the solar cell substrate that are heated, or laser doping also may be used to perform certain embodiments of the process described herein. Furthermore, while a specific silicon solar cell design is disclosed, other solar cell workpiece materials or solar cell designs also may benefit from embodiments of the process described herein.

Figure 1:
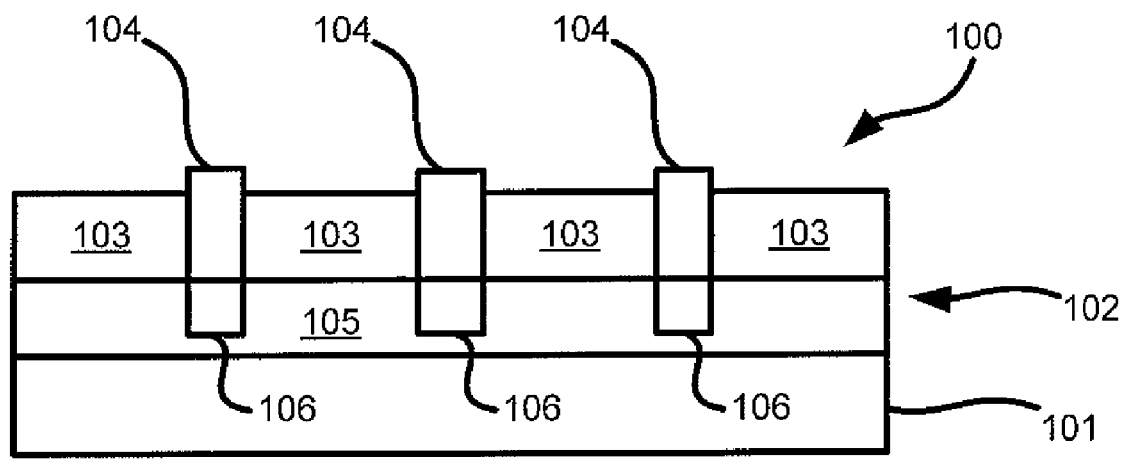
FIG. 1 is a cross-sectional view of an exemplary solar cell.

FIG. 1 is a cross-sectional view of an exemplary solar cell. Other embodiments or designs are possible and the embodiments of the process described herein are not solely limited to the solar cell 100 illustrated in FIG. 1. The solar cell 100 includes a base 101 and an emitter 102. The emitter 102 includes first doped region 105 and second doped regions 106. The base 101 and emitter 102 are oppositely doped such that one is n-type and the other is p-type. Above the emitter 102 is an anti-reflective coating 103. This anti-reflective coating 103 may be SiN. In one particular embodiment, an oxide layer (not illustrated) is disposed between the anti-reflective coating 103 and the emitter 102. Metal lines 104 are located above the emitter 102 within the anti-reflective coating 103. While a metal line 104 is specifically disclosed, other conductors also may be used. In one instance, the second doped regions 106 are doped to a higher concentration than the first doped region 105.

Figure 2:
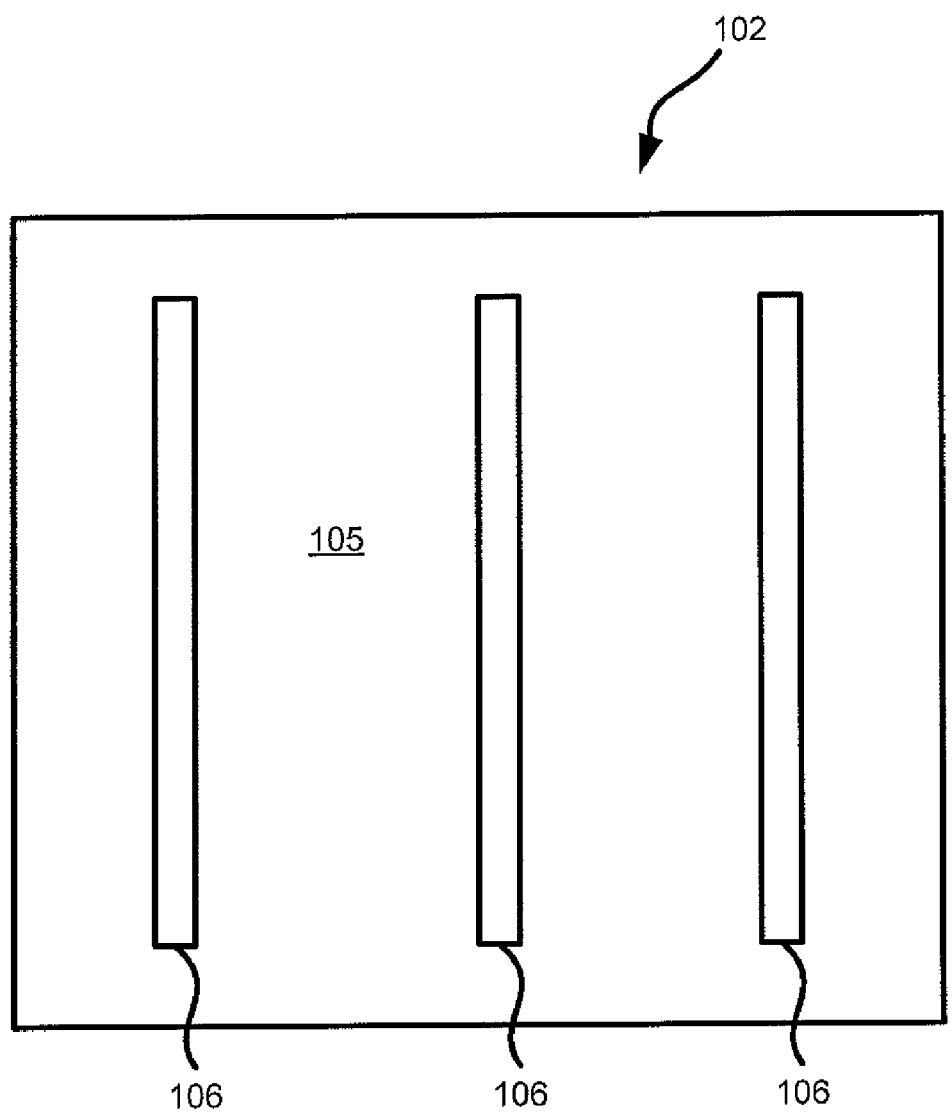
FIG. 2 is a top perspective view of an exemplary solar cell.

FIG. 2 is a top perspective view of an exemplary solar cell. The emitter 102 has a first doped region 105. The second doped regions 106 are located within the first doped region 105. An emitter 102 may have multiple second doped regions 106. Each of these second doped regions 106 may correspond with the position of a metal line 104 as illustrated in FIG. 1, although other patterns or doping locations are possible. To accomplish the doping of the second doped regions 106, dopants may be introduced into the second doped regions 106 using, for example, a beam line ion implanter, plasma immersion, or gaseous diffusion. A mask on or over the emitter 102 may enable doping of the second doped regions 106 and not the entire emitter 102.

In the embodiments of the process described herein, the dopants may be, for example, P, As, B, Sb, Al, or In. Other dopant species also may be used and this application is not limited merely to the dopants listed. While the embodiments of this process specifically discuss using the mask for solar cells, embodiments of this process also may be applied to other workpieces, such as semiconductor wafers or flat panels.

Figure 3:
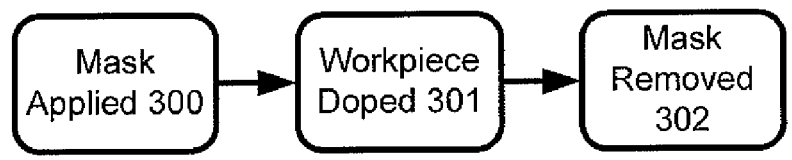
FIG. 3 is a flowchart illustrating one method of doping a workpiece.

FIG. 3 is a flowchart illustrating one method of doping a workpiece. Such a process avoids expensive photoresist lithography processes or complex alignment of a stencil or shadow mask over the workpiece. First, a mask is applied 300 to a workpiece. This workpiece may, in one instance, be a solar cell 100 that include an emitter 102 with a first doped region 105 as seen in FIGS. 1-2. In a second instance, the workpiece may be a solar cell that has not had an emitter formed yet, but has a base 101 formed as illustrated in FIG. 1. In a third instance, the workpiece has some regions doped other than an emitter or base. In a fourth instance, the workpiece is completely undoped.

A mask may be applied using, for example, ink jet printing, screen printing, stamping, or other methods known to those skilled in the art. Ink jet printers eject modulated droplets of liquid through an array of nozzles onto a surface, such as a surface of a solar cell 100. The nozzles may be controlled by, for example, a piezo electric motor or other methods known to those skilled in the art. The surface may be scanned across this array of nozzles, though the array of nozzles may be scanned as well.

Second, the workpiece is doped 301. This doping may use a beamline ion implanter, a plasma doping ion implanter, thermal or gaseous diffusion, or other methods known to those skilled in the art. The workpiece will primarily be doped through apertures in the mask. The mask will prevent pr reduce doping to at least a portion of the workpiece.

Third, the mask is removed 302. This removal may involve evaporating the mask, forming a volatile product from the mask when exposed to a gas, or dissolving the mask when exposed to a solvent. Of course, other removal methods known to those skilled in the art may be used independently or together with these methods. For example, the mask also may be physically removed by wiping, mild abrasion, or other mechanical processes. Furthermore, some of these removal methods may occur during existing processing steps, reducing the overall manufacturing costs. In another embodiment, the mask may be removed by evaporation without specific removal actions. This reduces the cost and complexity of any manufacturing process.

FIG. 4A-E are cross-sectional views illustrating a first embodiment of a method of doping a workpiece. The workpiece 400 in FIG. 4A may be doped, partially doped, or undoped. This workpiece 400 may be a solar cell, such as part of the solar cell 100 of FIG. 1, or other workpieces. For example, a first doped region 105 as illustrated in FIG. 1 may be included in the workpiece 400 of FIG. 4A.

Figure 4:
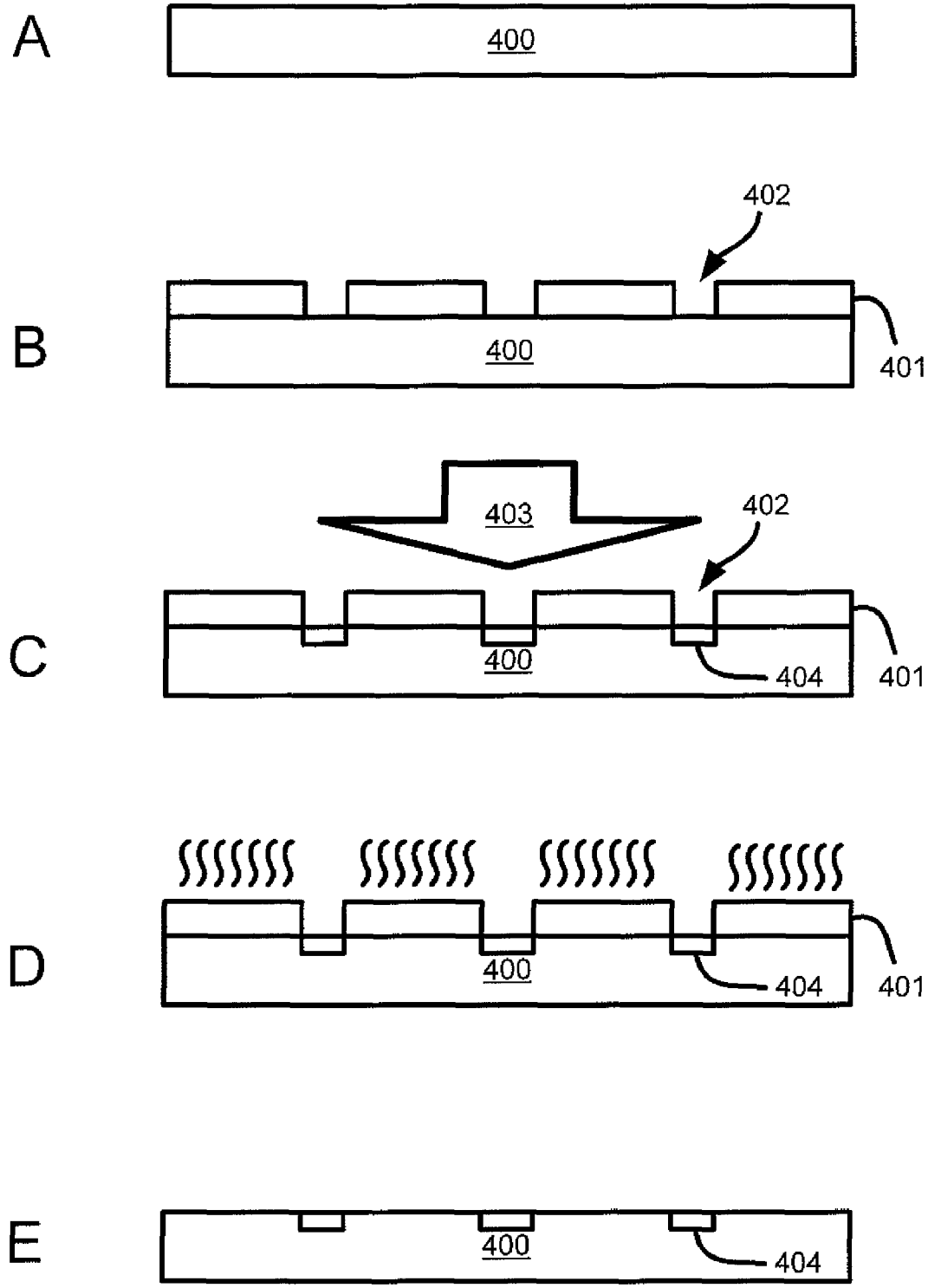
FIG. 4A-E are cross-sectional views illustrating a first embodiment of a method of doping a workpiece.

In FIG. 4B a material 401 is applied to the workpiece 400. The material 401 may be applied using ink jet printing or other methods. The material 401 may be, for example, wax, carbon dioxide, xenon difluoride, or xenon trifluoride. The material also may be other materials with a sufficient vapor pressure at temperatures above an implant or processing temperature, but below the temperature at which damage occurs to the workpiece 400. To align the material 401 to the workpiece 400, an edge of the workpiece 400 may be used as a reference. In another instance, the material 401 is aligned to the workpiece using optical measurements or sensors. The material 401 may be frozen on the workpiece 400 in one embodiment. This may involve cooling the workpiece 400 or the atmosphere to below the freezing temperature of the material 401.

Apertures 402 are formed in the material 401. During the application of the material 401, a space or gap is left where the aperture 402 is required. Thus, the apertures 402 may be formed when the material 401 is applied to the workpiece 400. In another instance, a portion of the material 401 is removed from the workpiece 400 to form the apertures 402. In yet another instance, the workpiece 400 is preferentially heated in certain portions to form the apertures 402, such as with a laser, electron beam, or focused ion beam.

In FIG. 4C, a species 403 is introduced through the apertures 402 in the material 401. The species 403 may be a dopant. The material 401 functions as a mask and prevents the species 403 from being introduced to certain regions of the workpiece 400. The material 401 may function as a mask due to its chemistry or thickness. For example, the thickness may exceed the projected range of species 403 that is introduced and may exceed this projected range by several times the straggle of the species 403. The material 401 in one embodiment may be approximately 2000 Angstroms to several micrometers in thickness. This species 403 forms the doped regions 404 in the workpiece 400. In one instance, the doped regions 404 correspond to the second doped regions 106 illustrated in FIG. 2. The species 403 in FIG. 4C may be introduced by ion implantation, gaseous diffusion, or other methods known to those skilled in the art. For example, a beam-line ion implanter, plasma doping ion implanter, or plasma immersion ion implanter may be used. A cold ion implantation, such as that between −100° C. and 0° C., may occur in one particular embodiment. Backside gas cooling on a platen or prechilling of the workpiece 400 may keep the workpiece 400 within such a temperature range during implantation.

In FIG. 4D, the material 401 evaporates off of the workpiece 400. This evaporation may occur during a specific thermal step, during an annealing or activation step for the doped regions 404, when any cooling to the workpiece 400 ceases, while the workpiece 400 is at rest, or using other methods known to those skilled in the art. This results in a workpiece 400 with doped regions 404 as illustrated in FIG. 4E. In one particular embodiment, the material 401 sublimes off of the workpiece 400 instead of evaporating.

FIG. 5A-E are cross-sectional views illustrating a second embodiment of a method of doping a workpiece. The workpiece 400 in FIG. 5A may be doped, partially doped, or undoped. This workpiece 400 may be a solar cell, such as part of the solar cell 100 of FIG. 1, or other workpieces. For example, a first doped region 105 as illustrated in FIG. 1 may be included in the workpiece 400 of FIG. 5A.

Figure 5:
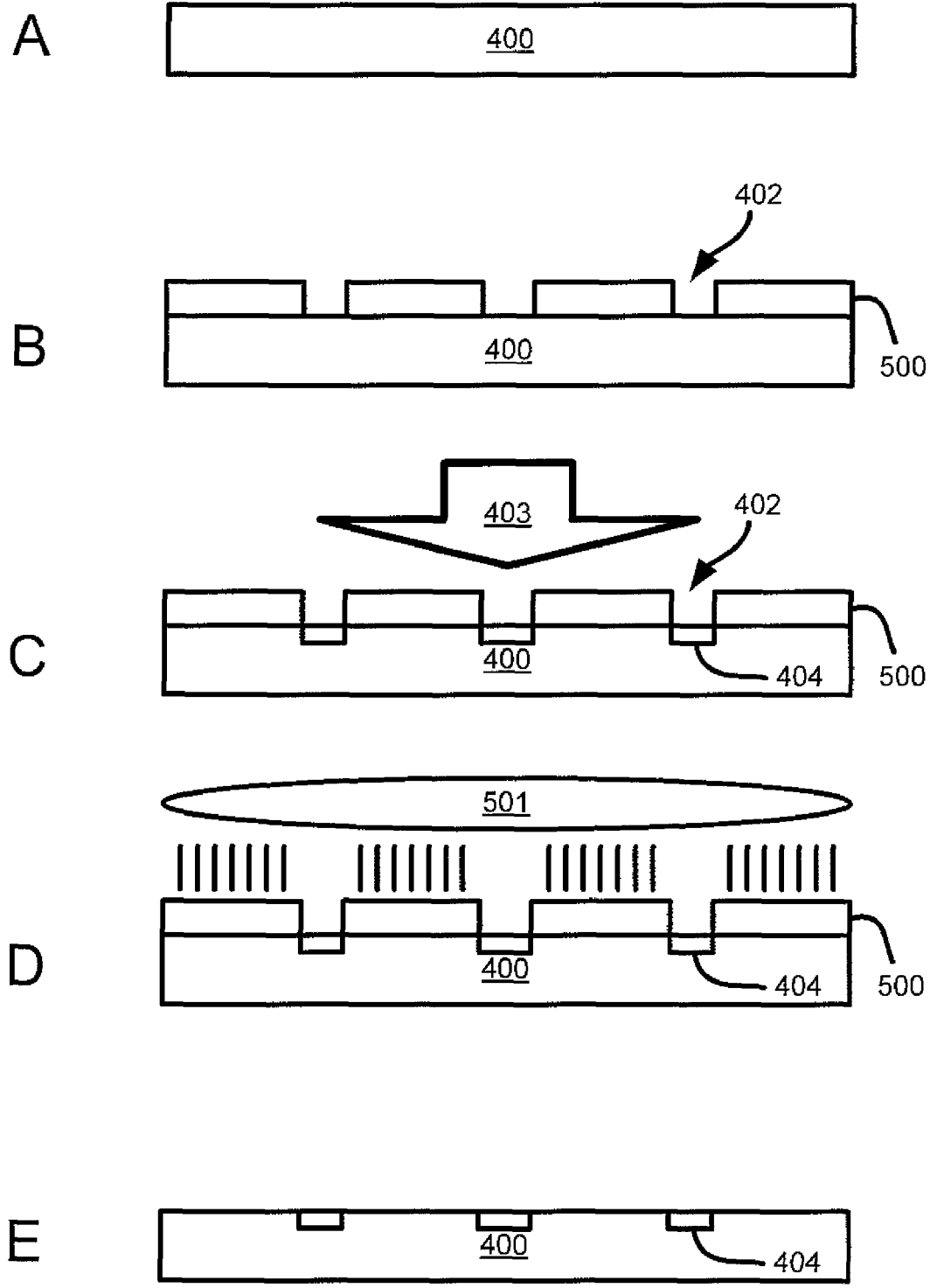
FIG. 5A-E are cross-sectional views illustrating a second embodiment of a method of doping a workpiece.

In FIG. 5B a material 500 is applied to the workpiece 400. The material 500 may be applied using ink jet printing or other methods. The material 500 may be, for example, wax, zinc, germanium, or a hydrocarbon such as, for example, benzene or butane. The material also may be other materials that are stable in a vacuum but react with a gas to form volatile products. To align the material 500 to the workpiece 400, an edge of the workpiece 400 may be used as a reference. In another instance, the material 500 is aligned to the workpiece using optical measurements or sensors. The material 500 may be frozen on the workpiece 400 in one embodiment. This may involve cooling the workpiece 400 or the atmosphere to below the freezing temperature of the material 500.

Apertures 402 are formed in the material 500. During the application of the material 500, a space or gap is left where the aperture 402 is required. Thus, the apertures 402 may be formed when the material 500 is applied to the workpiece 400. In another instance, a portion of the material 500 is removed from the workpiece 400 to form the apertures 402. In yet another instance, the workpiece 400 is preferentially heated in certain portions to form the apertures 402, such as with a laser, electron beam, or focused ion beam.

In FIG. 5C, a species 403 is introduced through the apertures 402 in the material 500. The species 403 may be a dopant. The material 500 functions as a mask and prevents the species 403 from being introduced to certain regions of the workpiece 400. The material 500 may function as a mask due to its chemistry or thickness. For example, the thickness may exceed the projected range of species 403 that is introduced and may exceed this projected range by several times the straggle of the species 403. The material 500 in one embodiment may be approximately 2000 Angstroms to several micrometers in thickness. This species 403 forms the doped regions 404 in the workpiece 400. In one instance, the doped regions 404 correspond to the second doped regions 106 illustrated in FIG. 2. The species 403 in FIG. 5C may be introduced by ion implantation, gaseous diffusion, or other methods known to those skilled in the art. For example, a beam-line ion implanter, plasma doping ion implanter, or plasma immersion ion implanter may be used. A cold ion implantation, such as that between $-100°$ C. and $0°$ C., may occur in one particular embodiment. Backside gas cooling on a platen or prechilling of the workpiece 400 may keep the workpiece 400 within such a temperature range during implantation.

In FIG. 5D, the material 500 is exposed to a gas 501. This gas may be $O_2$, $NF_3$, or $F_2$, for example. The material 500 forms a volatile product with the gas 501 and is removed from the workpiece 400. In one embodiment, the material 500 is a hydrocarbon and the gas 501 is $O_2$. The workpiece 400 is placed in a furnace and the material 500 is burned off of the workpiece 400 when exposed to the gas 501. This results in a workpiece 400 with doped regions 404 as illustrated in FIG. 5E. In one particular embodiment, the material 500 forms a volatile product with the gas 501 during an activation or anneal step for the workpiece 400 or doped regions 404.

FIG. 6A-E are cross-sectional views illustrating a third embodiment of a method of doping a workpiece. The workpiece 400 in FIG. 6A may be doped, partially doped, or undoped. This workpiece 400 may be a solar cell, such as part of the solar cell 100 of FIG. 1, or other workpieces. For example, a first doped region 105 as illustrated in FIG. 1 may be included in the workpiece 400 of FIG. 6A.

Figure 6:
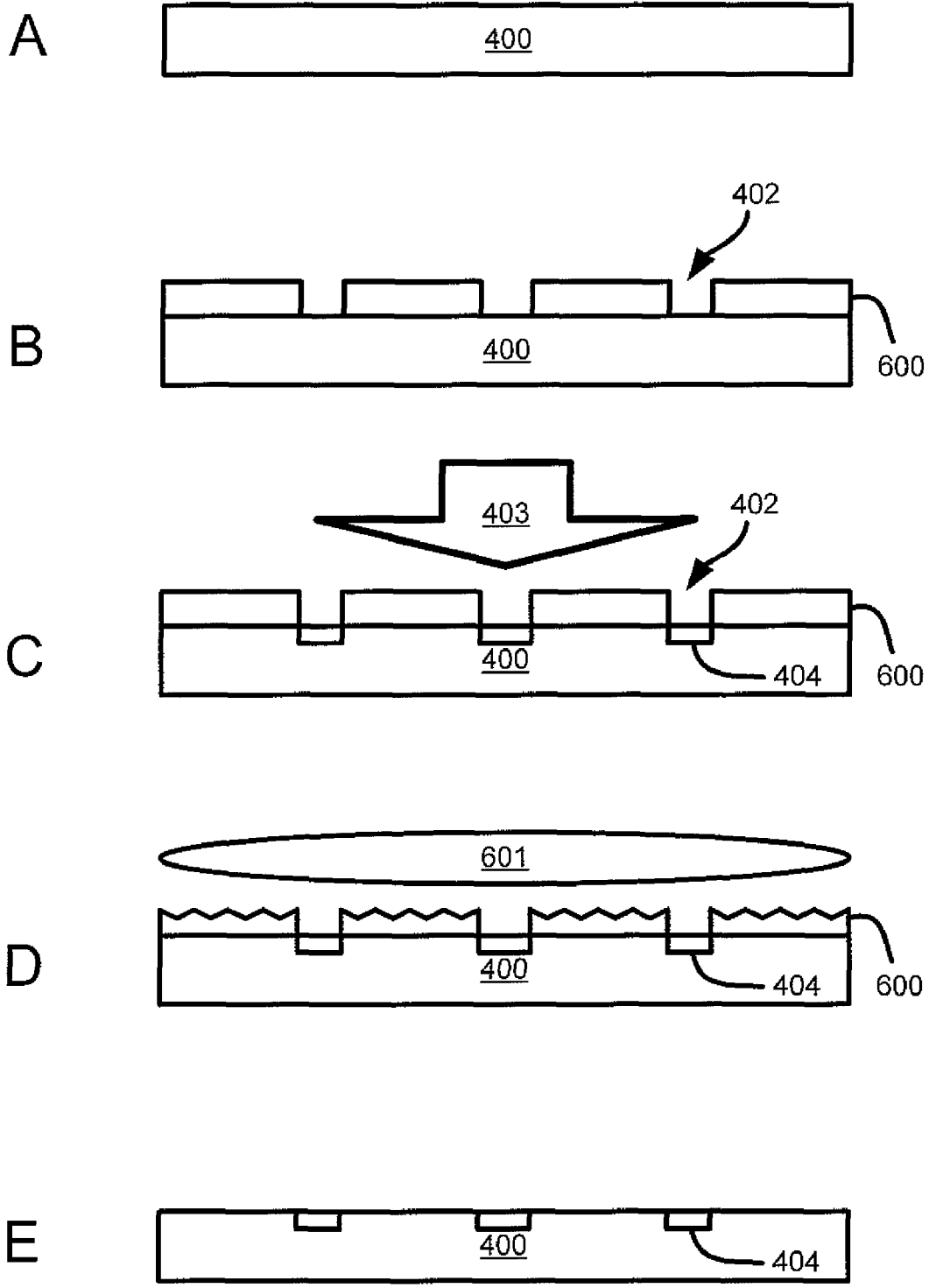
FIG. 6A-E are cross-sectional views illustrating a third embodiment of a method of doping a workpiece.

In FIG. 6B a material 600 is applied to the workpiece 400. The material 600 may be applied using ink jet printing or other methods. The material 600 may be, for example, wax, glycerin, antimony oxide, a hydrocarbon, and graphite. The hydrocarbon may be, for example, benzene or butane. A graphite compound such as AQUADAG or some other water-based colloidal graphite suspension may be used. The material also may be other materials that are stable in dry atmospheres, but that dissolve in a solvent such as water or an organic compound. To align the material 600 to the workpiece 400, an edge of the workpiece 400 may be used as a reference. In another instance, the material 600 is aligned to the workpiece using optical measurements or sensors. The material 600 may be frozen on the workpiece 400 in one embodiment. This may involve cooling the workpiece 400 or the atmosphere to below the freezing temperature of the material 600.

Apertures 402 are formed in the material 600. During the application of the material 600, a space or gap is left where the aperture 402 is required. Thus, the apertures 402 may be formed when the material 600 is applied to the workpiece 400. In another instance, a portion of the material 600 is removed from the workpiece 400 to form the apertures 402. In yet another instance, the workpiece 400 is preferentially heated in certain portions to form the apertures 402, such as with a laser, electron beam, or focused ion beam.

In FIG. 6C, a species 403 is introduced through the apertures 402 in the material 600. The species 403 may be a dopant. The material 600 functions as a mask and prevents the species 403 from being introduced to certain regions of the workpiece 400. The material 600 may function as a mask due to its chemistry or thickness. For example, the thickness may exceed the projected range of species 403 that is introduced and may exceed this projected range by several times the straggle of the species 403. The material 600 in one embodiment may be approximately 2000 Angstroms to several micrometers in thickness. This species 403 forms the doped regions 404 in the workpiece 400. In one instance, the doped regions 404 correspond to the second doped regions 106 illustrated in FIG. 2. The species 403 in FIG. 6C may be introduced by ion implantation, gaseous diffusion, or other methods known to those skilled in the art. For example, a beam-line ion implanter, plasma doping ion implanter, or plasma immersion ion implanter may be used. A cold ion implantation, such as that between $-100°$ C. and $0°$ C., may occur in one particular embodiment. Backside gas cooling on a platen or prechilling of the workpiece 400 may keep the workpiece 400 within such a temperature range during implantation.

In FIG. 6D, the material 600 is exposed to a solvent 601, such as water or an organic compound. The solvent 601 also may be water with a wetting agent or surfactant. The organic compound used in the solvent 601 may be, for example, ethyl alcohols, methyl alcohols, or toluene. A solution of water and organic compounds also may be used as a solvent 601. The material 600 is rinsed off, washed off, dissolved, or otherwise removed by the solvent 601. This results in a workpiece 400 with doped regions 404 as illustrated in FIG. 6E.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a workpiece comprising:
    applying a material to a workpiece, said material defining a plurality of apertures, wherein said material is selected from the group consisting of wax, carbon dioxide, xenon difluoride, and xenon trifluoride;
    introducing a species into said workpiece through said plurality of apertures; and
    evaporating said material off said workpiece.

2. The method of claim 1, wherein said introducing is selected from the group consisting of ion implantation and gaseous diffusion.

3. The method of claim 1, wherein said workpiece is a solar cell and said introducing through said plurality of apertures forms a plurality of doped regions.

4. The method of claim 1, further comprising freezing said material.

5. The method of claim 1, further comprising activating said workpiece, wherein said evaporating and said activating occur at least partially simultaneously.

6. The method of claim 2, wherein said introducing comprises ion implantation and said ion implantation occurs while said workpiece is maintained at a temperature between −100° C. and 0° C.

7. A method of fabricating a workpiece comprising:
    applying a material to a workpiece, said material defining a plurality of apertures, wherein said material is selected from the group consisting of wax, zinc, germanium, benzene, and butane;
    introducing a species into said workpiece through said plurality of apertures;
    exposing said workpiece to a gas;
    forming a volatile product from said material thereby removing said material from said workpiece; and
    activating said workpiece, wherein said exposing, said forming, and said activating occur at least partially simultaneously.

8. The method of claim 7, wherein said gas is selected from the group consisting of $O_2$, $NF_3$, and $F_2$.

9. The method of claim 7, wherein said introducing is selected from the group consisting of ion implantation and gaseous diffusion.

10. The method of claim 9, wherein said introducing comprises ion implantation and said ion implantation occurs while said workpiece is maintained at a temperature between −100° C. and 0° C.

11. The method of claim 7, wherein said workpiece is a solar cell and said introducing through said plurality of apertures forms a plurality of doped regions.

12. The method of claim 7, further comprising freezing said material.

13. A method of fabricating a workpiece comprising:
    applying a material to a workpiece, said material defining a plurality of apertures, wherein said material is selected from the group consisting of wax, glycerin, antimony oxide, benzene, butane, graphite, and a graphite compound;
    introducing a species into said workpiece through said plurality of apertures;
    exposing said material to a solvent; and
    dissolving said material from said workpiece.

14. The method of claim 13, wherein said introducing is selected from the group consisting of ion implantation and gaseous diffusion.

15. The method of claim 13, further comprising freezing said material.

16. The method of claim 13, wherein said workpiece is a solar cell and said introducing through said plurality of apertures forms a plurality of doped regions.

17. The method of claim 13, wherein said solvent is selected from the group of water and an organic compound.

18. The method of claim 14, wherein said introducing comprises ion implantation and said ion implantation occurs while said workpiece is maintained at a temperature between −100° C. and 0° C.

* * * * *